(12) United States Patent
Tuttle

(10) Patent No.: US 11,243,568 B2
(45) Date of Patent: Feb. 8, 2022

(54) MAINTAINING PRIVACY WITH MOBILE COMPUTING DEVICES

(71) Applicant: Cor Sanctum, LLC, Dexter, MI (US)

(72) Inventor: John L. Tuttle, Dexter, MI (US)

(73) Assignee: Cor Sanctum, LLC, Dexter, MI (US)

( * ) Notice: Subject to any disclaimer, the term of this patent is extended or adjusted under 35 U.S.C. 154(b) by 0 days.

(21) Appl. No.: 17/034,704

(22) Filed: Sep. 28, 2020

(65) Prior Publication Data

US 2021/0011515 A1    Jan. 14, 2021

Related U.S. Application Data

(63) Continuation of application No. 16/436,340, filed on Jun. 10, 2019, now Pat. No. 10,831,236.

(60) Provisional application No. 62/682,175, filed on Jun. 8, 2018.

(51) Int. Cl.
*G06F 1/16* (2006.01)
*H05K 5/03* (2006.01)

(52) U.S. Cl.
CPC .......... *G06F 1/1632* (2013.01); *G06F 1/1643* (2013.01); *G06F 1/1656* (2013.01); *G06F 1/1688* (2013.01); *H05K 5/03* (2013.01)

(58) Field of Classification Search
CPC combination set(s) only.
See application file for complete search history.

(56) References Cited

U.S. PATENT DOCUMENTS

| | | |
|---|---|---|
| 5,586,168 A | 12/1996 | Bucalo |
| 8,203,850 B2 | 6/2012 | Bouza, II et al. |
| 8,699,235 B2 | 4/2014 | Soufan |
| 9,336,768 B2 | 5/2016 | Soufan et al. |
| 9,720,639 B1 | 8/2017 | Morgan |
| 9,747,884 B2 | 8/2017 | Lehmann |
| 9,910,632 B1 | 3/2018 | Morgan |
| 10,009,933 B2 | 6/2018 | Morgan |
| 2015/0059251 A1 | 3/2015 | Rinner |
| 2018/0277086 A1 | 9/2018 | Soffer |
| 2020/0058283 A1 | 2/2020 | Fong |
| 2020/0090634 A1 | 3/2020 | Moran, Jr. |

*Primary Examiner* — David L Ton
(74) *Attorney, Agent, or Firm* — Fish & Richardson P.C.

(57) ABSTRACT

The present disclosure generally relates to systems for maintaining a user's privacy in relation to mobile computing devices. In one general aspect a system includes an acoustically insulated housing, a speaker system, a touchscreen, and a control system. The housing has an interior sized to contain a mobile computing device. The speaker system includes a speaker arranged to direct sound into the interior volume. The control system is configured to perform operations that include causing the speaker system to emit voice obscuring noise into the interior volume of the housing, receiving display data indicating content displayed on a touchscreen of the mobile computing device, causing the touchscreen display to present the display data in a manner that substantially mirrors the content as displayed on the touchscreen of the mobile computing device, and providing control signals indicating user inputs received on the touchscreen to control functions of the mobile computing device.

20 Claims, 7 Drawing Sheets

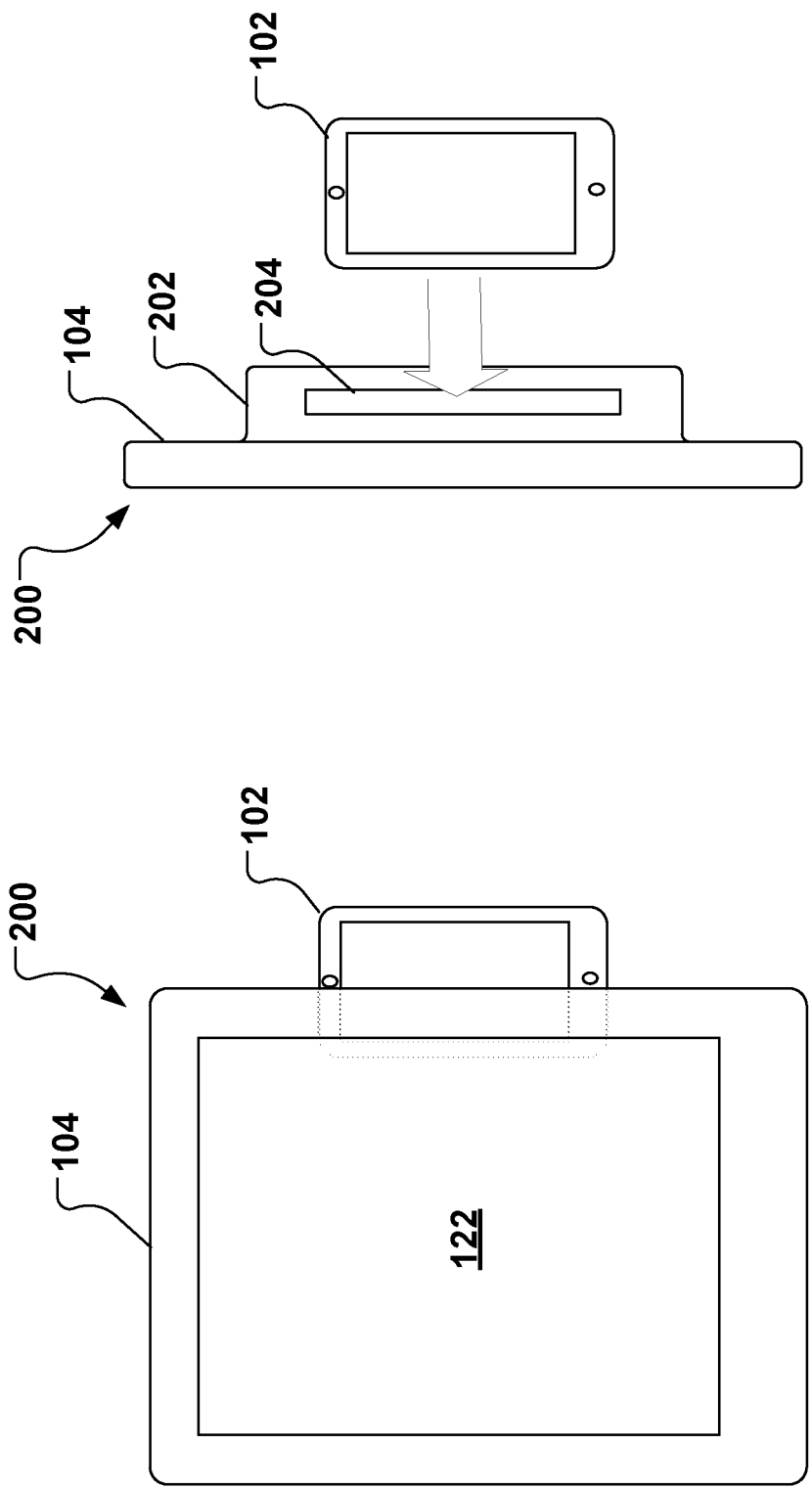

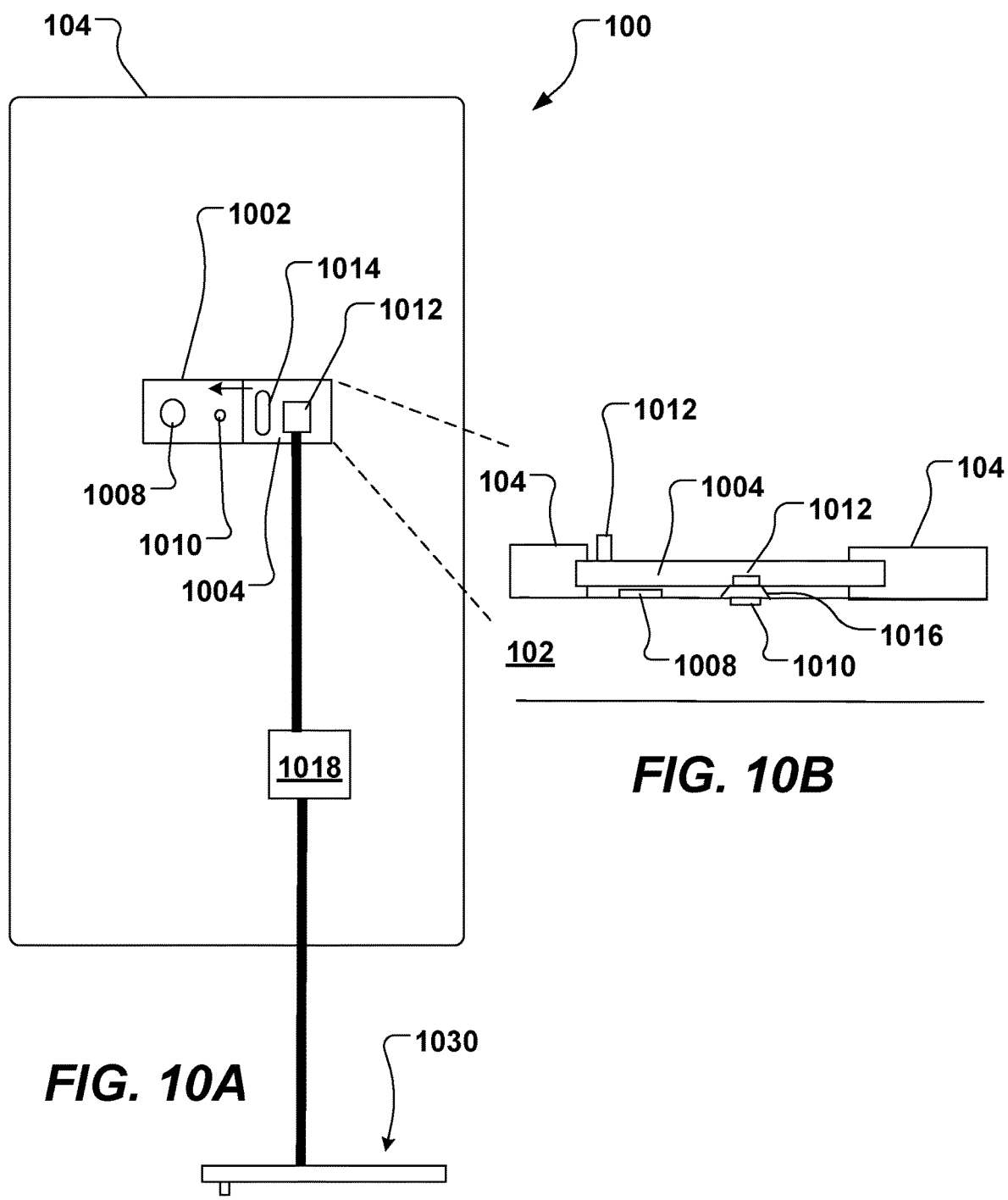

MAINTAINING PRIVACY WITH MOBILE COMPUTING DEVICES

CROSS-REFERENCE TO RELATED APPLICATION

This application is a continuation U.S. application Ser. No. 16/436,340, filed Jun. 10, 2019, which claims the benefit of the filing date of U.S. Provisional Application No. 62/682,175, filed on Jun. 8, 2018. The contents of which are incorporated herein by reference in their entirety.

BACKGROUND

Consumers are ever more aware that mobile computing devices such as smartphones and tablet computers regularly capture user conversations without user interaction. In some instances, the captured speech is used to target advertising to the user through in-app advertisements. Some, however, consider this practice a violation of privacy. Systems and devices that prevent or limit such unwanted eavesdropping while still providing a user with access to desired functions of their mobile computing devices are desirable.

SUMMARY

Implementations of the present disclosure are generally directed to maintaining user privacy in relation to mobile computing devices. Specifically, implementations of the present disclosure obscure or block a mobile computing device's ability to capture audio and/or video of a user. Implementations permit the user to interact with other desired functions of the mobile computing device while obscuring the device's microphone(s) and/or camera(s).

In a first aspect, the disclosure features a user privacy system that includes an acoustically insulated housing, an internal speaker system, a touchscreen display, a communication interface, and a control system. The acoustically insulated housing includes an interior volume sized to contain a mobile computing device therein. The internal speaker system includes at least one speaker arranged to direct sound into the interior volume. The touchscreen display is disposed on an outer surface of the housing. The control system is electrically coupled to the speaker system, the touchscreen display, and the communication interface. The control system is configured to perform operations that include: causing the speaker system to emit voice obscuring noise into the interior volume of the housing, receiving display data from the mobile computing device that indicates content displayed on a touchscreen of the mobile computing device, causing the touchscreen display to present the display data in a manner that substantially mirrors the content as displayed on the touchscreen of the mobile computing device, and providing, to the mobile computing device, control signals indicating user inputs received on the touchscreen display to control functions of the mobile computing devices.

This and other implementations can each optionally include one or more of the following features.

In some implementations, the control system includes at least one processor electrically coupled to the speaker system and to the touchscreen display; and a data store electrically coupled to the at least one processor having instructions stored thereon which, when executed by the at least one processor, causes the at least one processor to perform the operations.

In some implementations, the voice obscuring noise includes at least one of: white noise, pink noise, or human speech.

In some implementations, the voice obscuring noise includes human speech comprising a voice of the user of the mobile computing device.

Some implementations include an external speaker system with at least one speaker arranged to direct sound outside of the housing, and the operations of the control system include receiving an audio stream from the mobile computing device, and causing the audio stream to be played on the external speaker system.

In some implementations, the housing is configured as a tablet computing device comprising a sound insulated compartment sized to contain a smartphone sized mobile computing device.

In some implementations, housing is installed in an upper surface of a table.

Some implementations include a projector, and the operations of the control system include causing the projector to present content received from the mobile computing device.

Some implementations include a lockable access door.

In some implementations, the voice obscuring noise includes a plurality of human voices.

In some implementations, the housing is installed in a vehicle.

In some implementations, the housing is configured as a protective case for the mobile computing device.

In some implementations, the internal speaker system includes a first speaker positioned to align with a first microphone of the mobile computing device when the mobile computing device is placed in the interior volume, and a second speaker positioned to align with a second microphone of the mobile computing device when the mobile computing device is placed in the interior volume. In some implementations, causing the speaker system to emit voice obscuring noise into the interior volume of the housing includes causing the first speaker to emit a different voice obscuring noise than the second speaker.

In a second aspect, the disclosure features privacy case for a mobile computing device that includes a housing, a cover, and a speaker system. The housing is configured to at least partially surround the mobile computing device, and the housing has an opening positioned to align with a microphone of the mobile computing device with mobile computing device installed in the case. The cover is configured to be moved between a first position and a second position, where the cover covers the opening when placed in the first position and does not cover the opening when in the second position. The cover includes a sound absorbing material positioned to overlap and surround the microphone with the cover in the first position. The speaker system is configured to emit voice obscuring sound through a channel in the sound absorbing material and into the microphone.

This and other implementations can each optionally include one or more of the following features.

Some implementations include an interface configured to plug into an output jack of the mobile computing device and connect the speaker system to the mobile computing device, and the speaker system is controllable by a software application installed on the mobile computing device.

Some implementations include a control system configured to control the speaker system.

In some implementations, the speaker system includes a speaker disposed on the cover and oriented to direct sound through the channel in the sound absorbing material.

In some implementations, the speaker system includes a speaker positioned in the case at a distance from the cover, and a waveguide channel arranged to direct sound from the speaker through the channel in the sound absorbing material.

Some implementations include a second cover configured to be moved between a third position and a fourth position, where the second cover overlaps a second opening when placed in the third position and does not cover the opening when in the fourth position. The second cover includes a second sound absorbing material positioned to overlap and surround a second microphone of the mobile computing device with the second cover in the third position. The speaker system is configured to emit voice obscuring sound through a channel in the second sound absorbing material and into the second microphone.

These and other implementations can provide one or more advantages. In some examples, implementations of the present disclosure block or obscure eavesdropping capabilities of mobile computing devices to help maintain a user's privacy. Implementations may enable the user to still interact with the majority of the functions of a mobile computing device while the eavesdropping capabilities of the device are obscured.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIG. 2A depicts a top view of an exemplary user privacy system. FIG. 2B depicts a side view of the exemplary user privacy system.

FIGS. 6-9 depict exemplary implementations of a portable user privacy system.

FIGS. 10A-10C depict various views of a user privacy system implemented as a protective case for a mobile computing device.

Like reference numbers and designations in the various drawings indicate like elements.

DETAILED DESCRIPTION

Implementations of the present disclosure are generally directed to user privacy systems for mobile computing devices (e.g., smartphones and tablet computers). For example, a user privacy system (UPS) can block or obscure eavesdropping capabilities of a mobile computing device while at the same time providing the user access to desired functionality of the mobile computing device. For example, a UPS can block or obscure ambient sounds at the microphone of the mobile computing device to prevent or minimize the ability of the mobile computing device from detecting private conversations of the user when the user does not intend those conversations to be captured by the mobile computing device. In some implementations, a UPS also covers or obscures the camera of the mobile computing device.

However, the UPS is configured to maintain operability with the mobile computing device while at the same time improving the user's privacy. For example, a UPS can substantially replicate the display and functionality of the mobile computing device on a touchscreen display of the UPS. For example, the UPS can include a touchscreen display that functions to mirror the display of the mobile computing device. The UPS can render images from the mobile computing device onto the UPS touchscreen. Likewise, the UPS can receive touchscreen inputs and pass the inputs to the mobile computing device to control functions of the mobile computing device as if the inputs were received on the mobile computing device's touchscreen.

Figure 1:
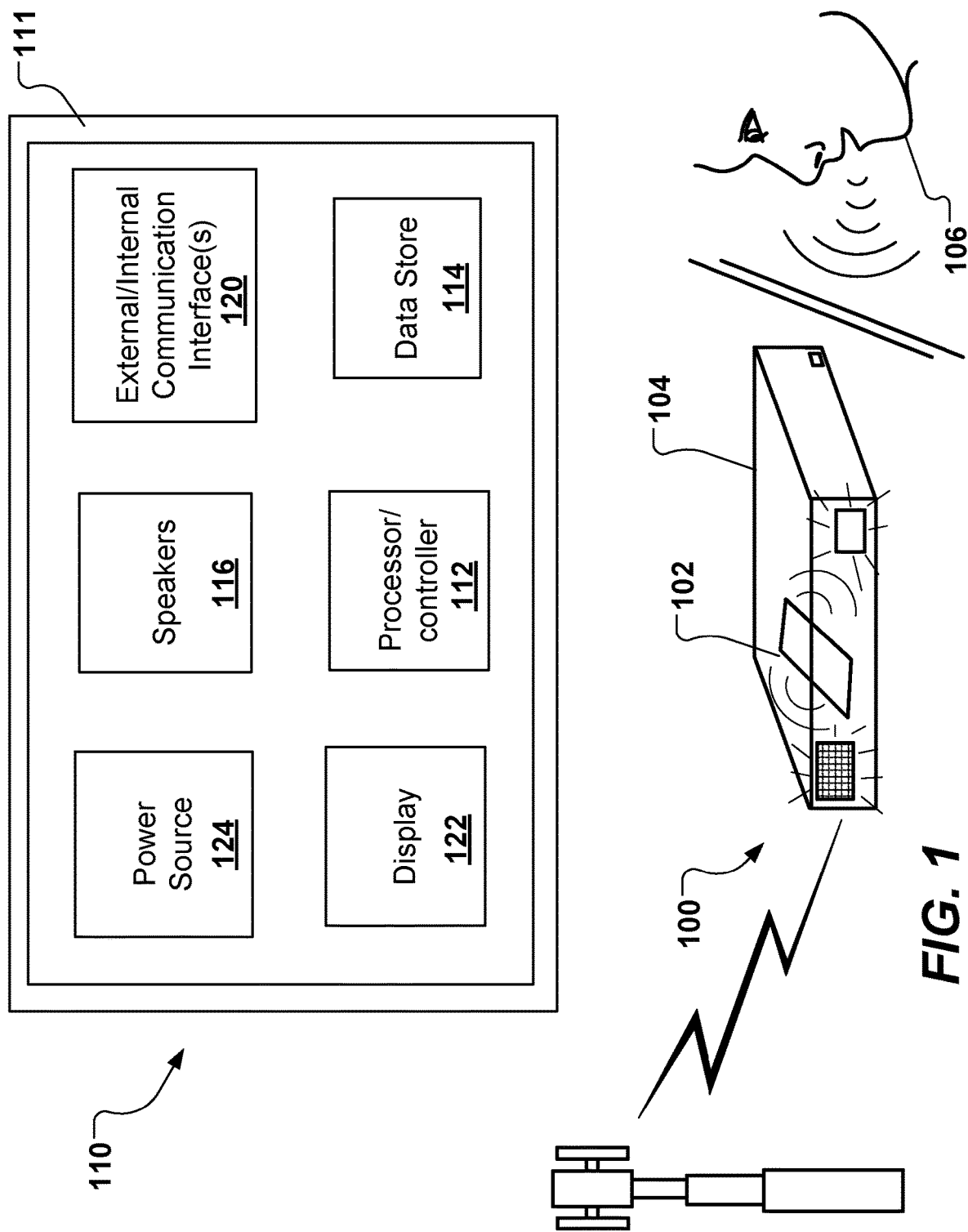
FIG. 1 depicts an exemplary user privacy system in accordance with implementations of the present disclosure.

FIG. 1 depicts an exemplary UPS 100 in accordance with implementations of the present disclosure. The UPS 100 includes a housing 104 with an interior volume size to contain a mobile computing device 102. For example, the housing 104 can be sized to contain a smart phone or a tablet computer. The housing 104 can be lined with or constructed from an acoustically insulating material 11. For example, the housing 104 can be partially or fully lined with a foam, rubber, or cloth material to attenuate external sounds such as speech uttered by the user 106. For example, the housing 104 can be constructed as soundproof box or container. However, in some implementations, the housing 104 does not block or interfere with radio frequency emissions to or from the computing device 102 when it is inside the UPS 100, so that the computing device 102 may still receive a phone call, text message, or data transmission, and communicate with a wireless hands-free device located outside the UPS 100.

The UPS 100 includes a processor 112, a data store 114, a speaker system 116, communications interface 120, a display 122, and a power source 124. The processor 112 can be, but is not limited to, one or more microprocessors or one or more microcontrollers. The processor 112 is electrically coupled to the data store 114, speaker system 116, communications interface 120, display 122, and power source 124. Together the processor 112 and data store 114 can be considered the control system of the UPS 100. In some implementations, the UPS 100 may be configured to leverage the computing device's processor and memory. For example, in implementations such as a portable version of the UPS (described in more detail below), the UPS's processor 112 and data store 114 may include a minimal level of control circuitry for interfacing with a computing device 102. The computing device itself may control the operations of the UPS 100, for example, through an application executed by the computing device 102.

The internal communication interface 120 can be a hardwired or wireless communication interface. In some implementations, the UPS 100 can include an external and internal communications interface 120. For example, the internal communications interface 120 can be configured to communicate with the computing device 102 when installed within the UPS 100. For example, an internal communications interface can be a hardwired communication and power jack adapted to plug into a corresponding jack of the computing device 102. For example, a hardwired communication interface can include, but is not limited to, a Lightning communication interface or a USB communication interface. In some implementations, the internal communication interface can also be a low-power wireless interface, such as Bluetooth or Zigbee. An external communication interface can be a wireless communication interface such as Wi-Fi or Bluetooth for communicating with other electronic or computing devices external to the UPS 100.

The speaker system 116 can include one or more speakers arranged to direct sound into the interior volume of the housing 104. In some implementations, the speakers of the speaker system 116 can be arranged within the inside of the housing 104 to substantially align with one or more microphones of the computing device 102. For example, the inside of the housing 104 can be configured with a speaker positioned on either end of the housing to align with a microphone at the top and a microphone at the bottom of the computing device 102. In some implementations, the inside of the housing 104 can be formed to fit a particular type of computing device. In addition, a hardwired communication interface can be positioned at a particular end of the housing 104, for example, to prompt the user to place the computing device 102 in a particular orientation within the housing 104 such that the microphones on the computing device 102 will substantially align with the internal speakers of the UPS 100.

In some implementations, the speaker system 116 can include an external speaker system having one or more speakers arranged to admit sound outside of the housing 104. For example, the external speaker system may permit the user to listen to music or other audio content from the computing device 102 while it is installed in the UPS 100. In some implementations, the UPS 100 can be configured as a home entertainment system that employs the computing device 102.

The display 122 can include, but is not limited to, an LCD display, an LED display, or a touchscreen display. For example, the display 122 can be disposed on an outer surface of the housing 104. In some implementations, the display 122 can be separate from the housing 104. For example, as described in more detail below, the display 122 can be provided as a separate portable display device that is in wireless communication with the UPS 100. For example, a portable display device can serve as a remote interface with the computing device 102 through the UPS 100 allowing the user nearly full functionality of the computing device 102 while at the same time ensuring that users privacy is maintained as a computing device 102 is isolated in the UPS 100.

The power source 124 can be a battery or a hardwired power source such as an electrical cord with associated power management circuitry (e.g., transformers, rectifiers, power fault protection circuits, etc.).

In operation, the UPS 100 causes the speaker system 116 to emit voice obscuring noise into the interior volume of the housing 104 when a computing device 102 is placed therein. For example, the control system of the UPS 100 causes the speaker system 116 (e.g., the internal speaker system) to emit voice obscuring noise into the interior volume of the housing 104. The voice obscuring noise will obscure any residual external sounds (such as user speech) that passes into the interior volume of the housing 104. The voice obscuring noise can include, but is not limited to, white noise, pink noise, randomized or other human speech, or a combination thereof. For example, the voice obscuring noise can be pink noise concentrated within a frequency band with that corresponds to the bandwidth of average human speech (e.g., approximately 85-255 Hz). In some implementations, the voice obscuring noise can be prerecorded or randomized human speech. For example the human speech can be recorded sound as the din of a crowded room with a plurality of different human voice ranges to obscure the external speech of the user. In some implementations, the voice obscuring noise can be tailored to a voice profile of the user or a family voice profile that encompasses voice profiles of each member of the user's family. In some implementations, the voice obscuring noise can include prerecorded speech in the user's own voice. For example, a voice sample of the user reading a paragraph or predefined set of words chosen to capture the full range of the user's voice can be used to generate the voice obscuring noise. In implementations that include more than one internal speaker, the USB 100 can control speaker to emit different voice obscuring noise. In some implementations, the different voice obscuring noise can be the same in content but time shifted between the different speakers, for example such implementations may aid in confusing any noise canceling capabilities of the computing device 102.

Furthermore, the UPS 100 also serves as an interface between the computing device 102 contained within the housing 104, the display 122, an external speaker system (when included), and optionally with external devices (e.g., a portable display device, wearable devices, etc.). For example, they control system of the UPS 100 can serve as a pipeline to provide the user with the ability to interact with the computing device 102 through the display 122, optional external speaker system, and other external devices. For example, the UPS 100 can receive data such as display data and audio data from the computing device 102 through an internal communication interface 120. The UPS 100 can drive the display 122 to present data in a manner that substantially mirrors content as displayed on a touchscreen of the computing device 102. The UPS 100 can receive input from the display 122 (e.g., from a driver of a touchscreen display) and pass the input to the computing device 102 to control functions of the 102. For example, touchscreen inputs received by the UPS display 122 can be passed to the computing device 102 using a similar input format to replicate touchscreen input as received on the touchscreen display of the computing device 102. Likewise, the UPS 100 can play audio data from the computing device 102 on an external speaker system of the UPS 100. In some examples, the UPS 100 can also serve as a pipeline for the computing device 102 to communicate with other external devices. For example, the UPS 100 may not have an integrated external audio system but may transfer audio stream data from the computing device 1022 to an external speaker system (e.g., an external Wi-Fi or Bluetooth enabled speaker system).

In some implementations, the UPS 100 includes a sensor to detect when a computing device 102 inside the UPS 100 produces an audible sound, and another sensor to detect when the computing device 102 produces a vibration. The UPS 100 includes a user interface, including but not limited to a light, audible speaker, vibrator, or a message display screen to alert the user on the outside when the UPS 100 detects that the computing device 102 inside the UPS 100 has emitted a sound or vibration.

FIG. 2A depicts a top view of an exemplary UPS 100. FIG. 2B depicts a side view of the exemplary UPS 200. The UPS 200 depicted in FIGS. 2A and 2B is an example of a UPS 100 configured as a tablet computing device. For example, UPS 200 may enable a user to maintain privacy while also converting a smaller computing device 102 (such as a smartphone) into a larger computing device, for example, the size of a tablet computing device. UPS 200 may leverage the processing power of computing device 102 while at the same time providing a user with additional privacy by obscuring the microphone and camera of computing device 102 and also providing the user with a larger work surface (e.g., touchscreen 122) to interact with their computing device 102. For example, the housing 104 and display 122 of UPS 200 can be comparably sized with common tablet computers. However, UPS 200 includes a compartment 202 into which computing device 102 can be placed. For example, compartment 202 can include a slot or door into which computing device 102 can be inserted. Compartment 202 can be configured similarly to the interior region of housing 104 as described above. That is compartment 202 can include internal communication interface and internal speakers as described above in reference to UPS 100. Compartment 202 can also be made from or lined with acoustically insulating material. Furthermore, implementations of UPS 200 can include any of the features described above with respect to UPS 100.

Figure 3A:
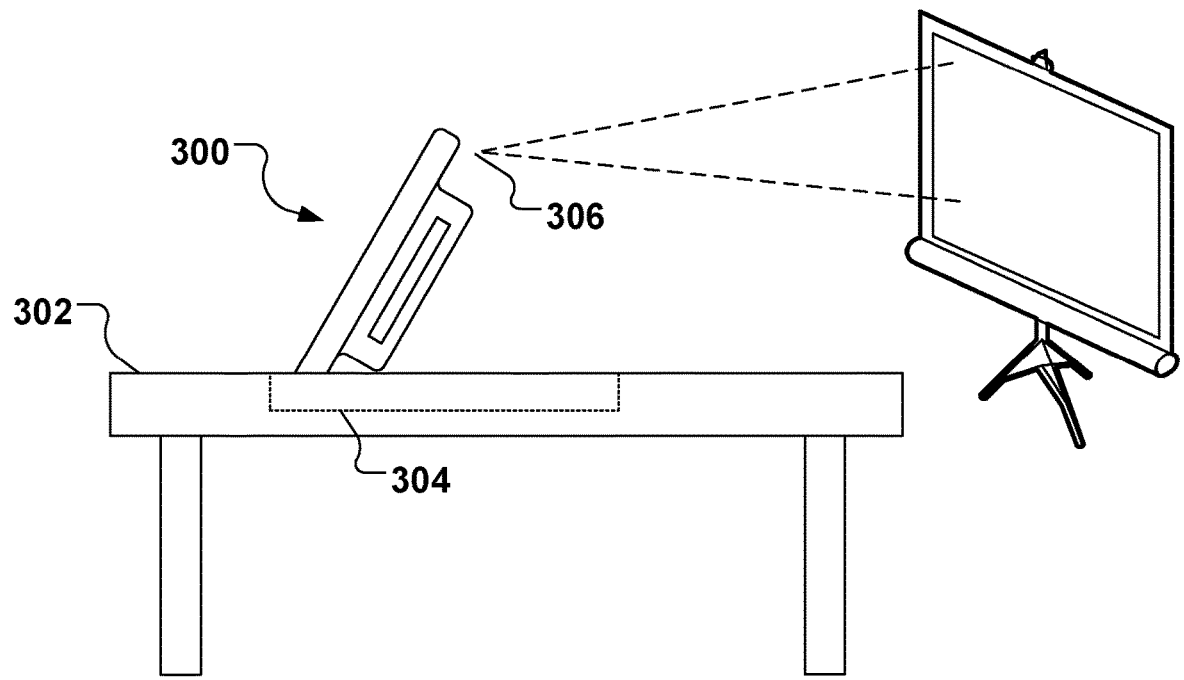
FIGS. 3A and 3B depict examples of a user privacy system that is integrated into a table or desk.
Figure 3B:
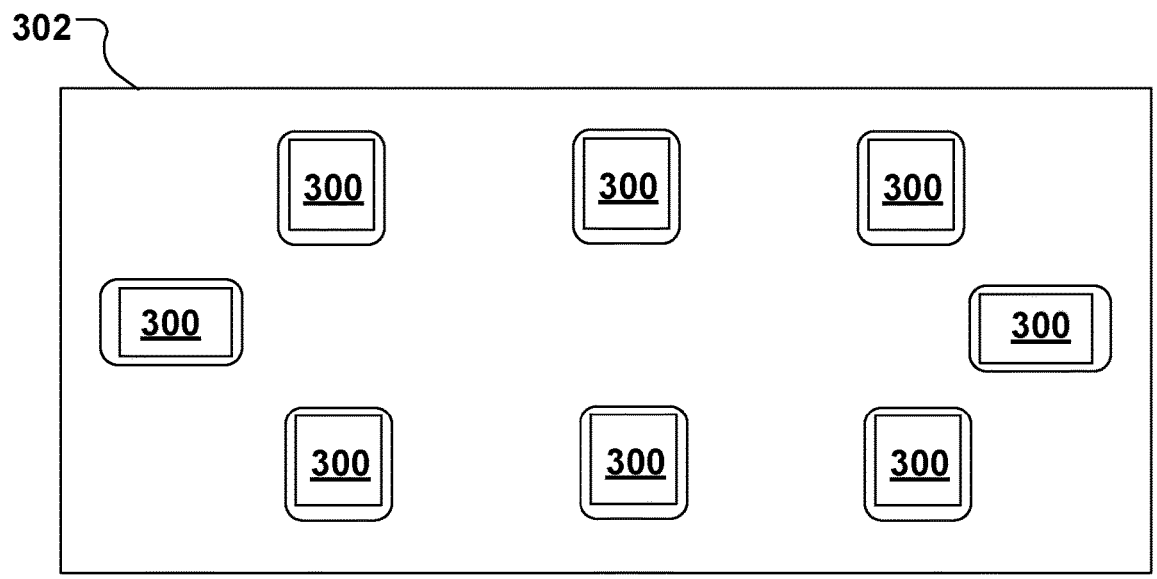

FIGS. 3A and 3B depict examples of a UPS 300 that is integrated into a table or desk. The UPS 300 depicted in FIGS. 3A and 3B is an example of a UPS 100 configured for use in professional or business environment. For example, UPS 300 can be mounted to or integrated into the top surface of a table 302. For example, table 302 can be a desk or a conference table. For instance, FIG. 3B illustrates several UPSs 300 mounted to a conference table 302. In some implementations, UPS 300 can be mounted to the table at a hinged joint which allows the UPS 300 to be pivoted upright or laid flat into a recess 304 within the table 302. In some implementations, UPS 300 can include a protector 306. For example, the projector 306 may permit a user in a business environment to present content from their computing device 102 for group of people. Thus, UPS 300 may permit professionals to make use of their computing devices in a confidential environment while still maintaining privacy and confidentiality of the topics discussed. Furthermore, implementations of UPS 300 can include any of the features described above with respect to UPS 100 or 200.

In some implementations, a UPS can include noise an active noise canceling system configured to actively cancel any ambient speech from outside of the UPS. For example, active noise cancellation systems can generate a negative waveform of the ambient noise and speech detected by a microphone or array of microphones of the UPS, and pass the negative waveform to the internal speakers of the UPS. In some implementations, the active noise cancellation system can be operated in conjunction with the voice obscuring noise.

In some implementations, the UPS can be configured to block or attenuate selective wireless communications from reaching a computing device installed within. For example, a UPS can be configured to block or attenuate selective wireless communications including, but not limited to, communications over Wi-Fi, Bluetooth, or other personal area networks by using a jamming device.

In some implementations, a UPS can be configured to interface with an external display monitor such as a television or other large monitor. For example, an entertainment system configuration of a UPS can include appropriate interfaces for connecting to a television including, but not limited to, an HDMI interface.

Figure 4:
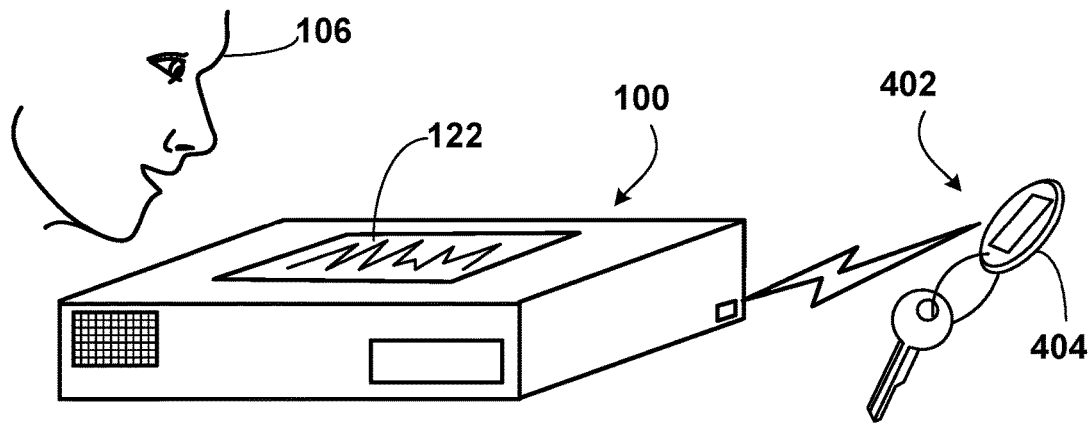
FIGS. 4-6 depict additional example implementations of a user privacy system.
Figure 5:
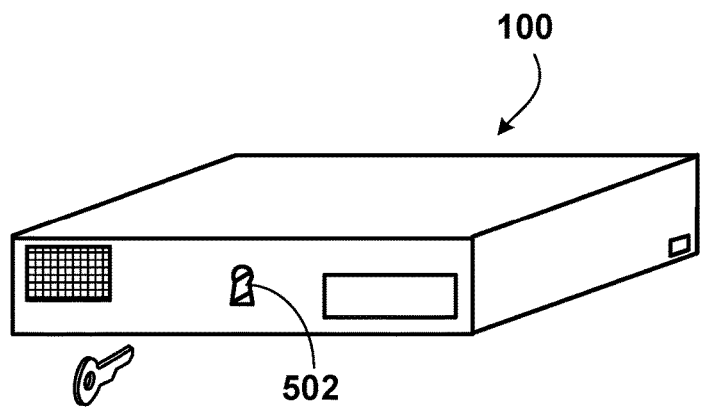
Figure 6:
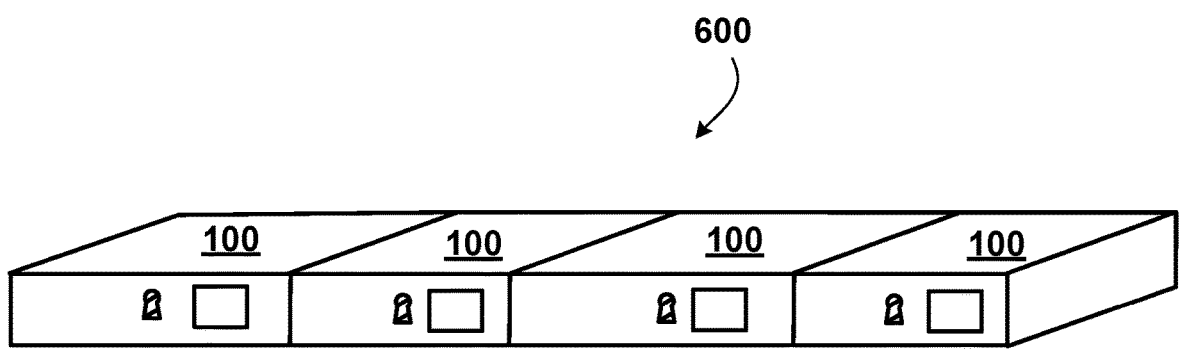

FIGS. 4-6 depict additional example implementations of UPSs. FIG. 4 depicts a UPS 100 that includes a separate secondary device with which the user can interact with a computing device 102 installed inside the UPS 100. The secondary 402 can be, for example, a FOB, a wearable device (e.g., a smart watch), or a remote tablet (as discussed above). In some implementations, a secondary device, e.g., a FOB, alerts the user to a message received on the computing device 102 by emitting sound, light, vibrations, or providing a message display screen 404 of the FOB. In some implementations, the secondary device 402 can be configured as a telephone handset. For example, the secondary device 402 can be a wireless telephone handset that allows a user to make and receive phone calls or send and receive text messages through the computing device 102 while it is installed in the UPS 100. In some implementations, a telephone handset include a mechanism such as a hardware on/off button to ensure the user that when the handset is not in use the microphone of the handset is affirmatively shut off so that the user speech cannot be surreptitiously detected without the user's consent.

FIG. 5 depicts a UPS 100 with the addition of a locking device 502. A locking device 502 can include, but is not limited to, a key, combination, or biometric lock.

FIG. 6 depicts a set 600 of multiple UPSs 100 to allow separate and independent storage of multiple computing devices 102.

FIGS. 6-9 depict exemplary implementations of a portable UPS 100.

Figure 7:
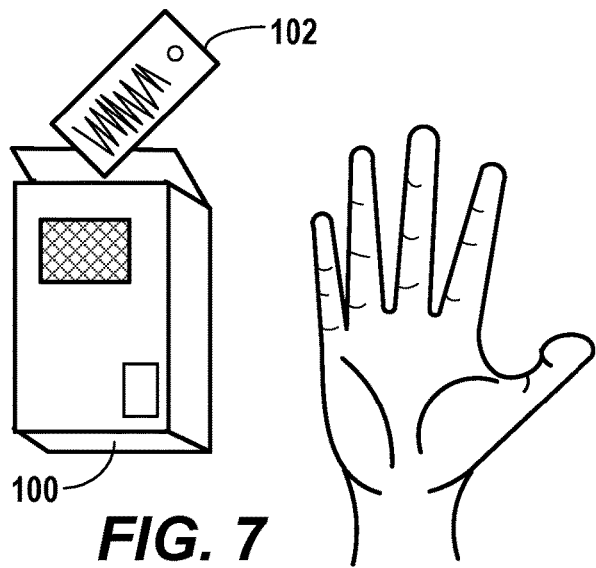
Figure 8:
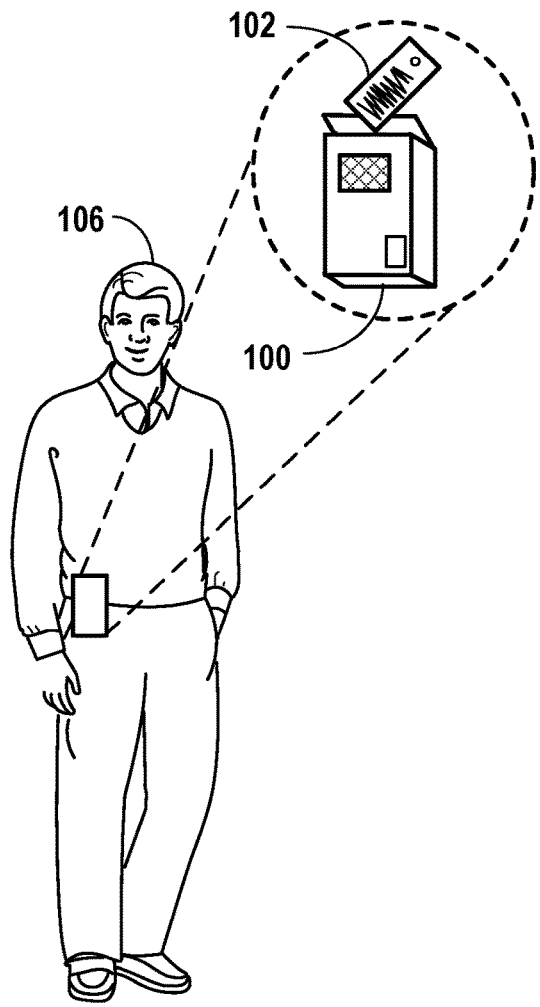
Figure 9:
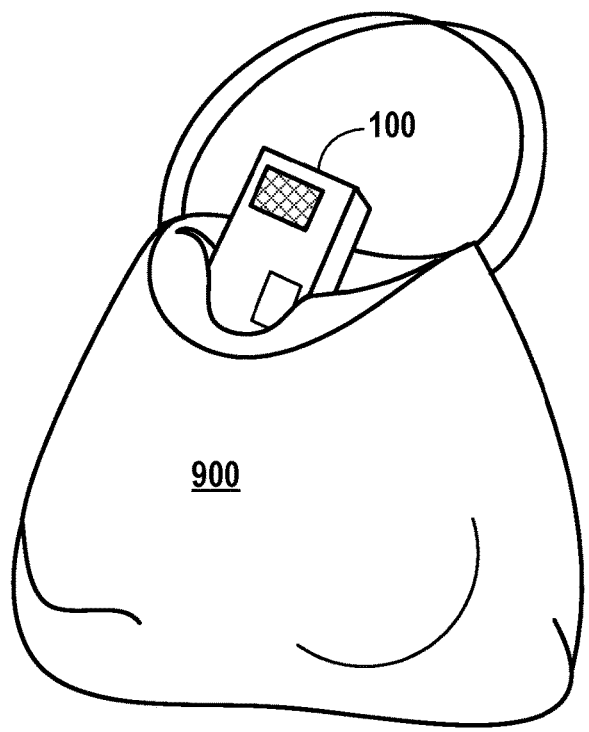

FIG. 7 depicts a UPS 100 suitable for carrying on the person. For example, a UPS 100 can be configured for a smaller size, comparable to a size of a computing device 102 for which the UPS 100 is designed. For example, a UPS 100 can be designed for use with particular types of smart phones and sized appropriately. FIG. 8 depicts a UPS 100 suitable to be worn on a user's belt. FIG. 9 depicts a UPS 100 suitable to be carried in a user's purse or bag 900. In some implementations, a portable UPS 100 can include an interface for wirelessly communicating, with a user's vehicle, allowing the vehicle to alert the driver to messages or notifications received by the computing device 102 inside the UPS 100.

Figure 10C:
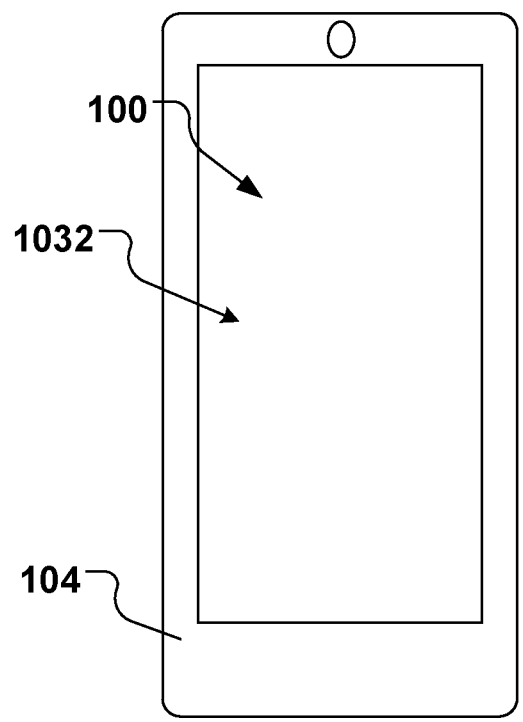

FIGS. 10A-10C depict various views of a UPS 1000 implemented as a protective case for a mobile computing device 102. The UPS 1000 includes a housing 104 configured as a protective case for computing device 102. For example, the housing 104 can be shaped to at least partially surround the mobile computing device 102. That is, the housing can be shaped to wrap around the back and sides of the mobile computing device 102, while leaving an opening 1032 in the front permit access to a touchscreen of the mobile computing device 102. In some implementations, the opening 1032 can be covered or sealed with a transparent material. As described above, the housing 104 can be made of or lined with an acoustically insulating material.

Referring to FIG. 10A, the UPS 1000 includes an opening 1002 with a movable cover 1004. The opening 1002 is substantially aligned with a microphone 1010 and a camera 1008 of the computing device 102. The cover 1004 is configured to be moved (e.g., slid) between an open and a closed position. The cover 1004 can include a tab 1014 to aid in moving the cover between the open and closed positions. For example, the cover 1004 can be moved (to the left in FIG. 10A) from side to side to reveal or cover the computing devices camera 1008 and microphone 1010. The cover 1004 allows a user to selectively shift the UPS 1000 between a privacy and a non-privacy mode, e.g., activate and deactivate the privacy function of the UPS.

FIG. 10B depicts an enlarged cross-sectional view of an exemplary opening 1002 and cover 1004 configuration. The cover 1004 includes a sound absorbing material 1016 disposed on an inside surface of the cover 1004. The sound absorbing material 1016 is positioned on the cover to substantially aligned with and overlap the microphone 1010 of the computing device 102 when the cover 1004 is in a closed position. In some implementations, the sound absorbing material 1016 can be shaped as a cone or cylinder. The sound absorbing material 1016 is sized to completely overlap the microphone 1010 and attenuate external sound (e.g., user speech). In some implementations, the sound absorbing material 1016 includes a channel passing through the center of the material. For example, the channel directs sound (e.g., voice obscuring noise) from a speaker system of the UPS 1000 into the microphone 1012 when the cover 1004 is in the closed position. In some implementations, the speaker system includes a speaker 1012 positioned proximate to the channel of the sound absorbing material 1016. In some implementations, the speaker system includes one or more speakers 1018 positioned in the case housing 104 at a distance from the sound absorbing material 1016. In such implementations, the speaker system includes waveguide channel 1020 to direct sound from the speakers 1018 to the channel in the sound absorbing material 1016 and into the microphone 1010. For example, it waveguide channel 1020 can be a channel through the housing that directs sound from a speaker system 1018 into one or more microphones of the computing device 102 to obscure the user's speech when the user desires privacy.

The UPS 1000 can be configured to match a microphone configuration of particular types of computing devices 102. For example, the UPS 1000 can include additional window/cover system 1030 similar to that described above to isolate each microphone of a computing device 102. For example, if a particular type of smartphone has one microphone on the back side (e.g., microphone 1010) and a second microphone or set of microphones on the bottom edge or front surface, a second window/cover system 1030 can be provided to cover and isolate the second microphone or set of microphones.

In some implementations, the UPS 1000 includes an interface configured to plug into an output jack of the mobile computing device 102. For example, the UPS can include a USB or lighting interface to plug into the computing devices 102 charging/serial data jack and connect the speaker system to the mobile computing device 102. In such implementations, the speaker system can be controlled to emit voice obscuring noise by a software application installed on the mobile computing device 102.

In some implementations, the UPS 1000 can include a supplemental battery. For example, implementations can induce a battery so operations of the UPS 1000 do not excessively drain the battery of the computing device. In some implementations, the battery can be size with an appropriate capacity to act as a supplemental battery for the computing device.

In some implementations, the UPS 1000 can include an external facing data/charging port (e.g., a USB or lightening port) to permit external connections to the computing device's data/charging port when the computing devices is installed in the UPS 1000. For example, the UPS 1000 can include an additional data/charging port along with appropriate circuitry to transfer data from an external device coupled to the additional data/charging port to the computing device 102.

In some implementations, the UPS 1000 can include additional window/cover configurations to individually cover and provide privacy for additional microphones and cameras on a computing device 102. For example, the UPS 1000 case can be modified to include additional window/cover configurations (similar to those described above) to cover each microphone and camera on a particular type of computing device. The window/cover configurations of the UPS 1000 can be arranged on the housing 104 (e.g., the protective case) to match the locations of the microphones/cameras on various different types (e.g., makes and models of computing devices).

Figure 11:
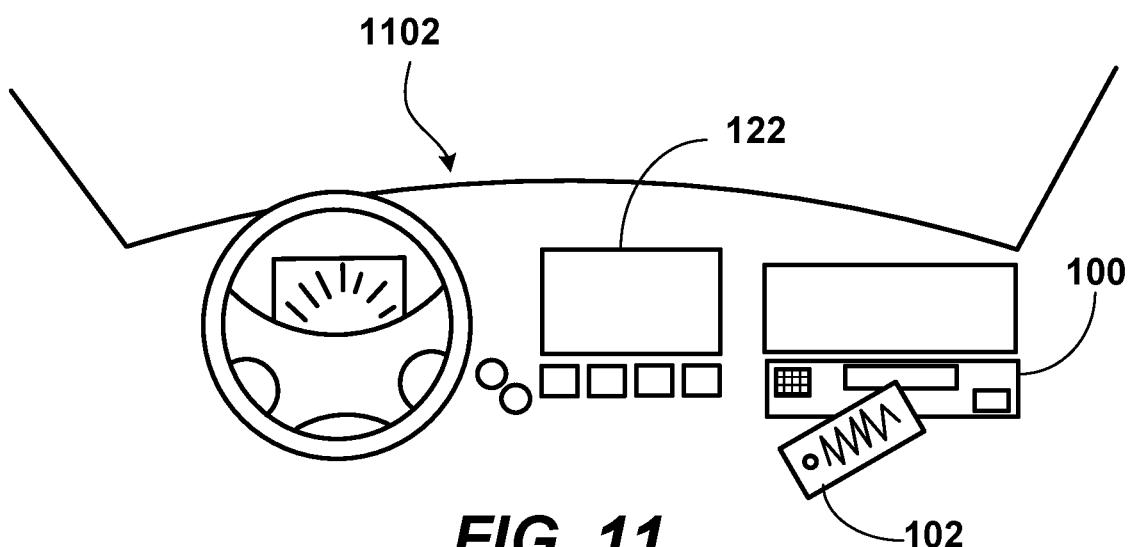
FIG. 11 depicts an example of a user privacy system that is integrated into a vehicle.

FIG. 11 depicts an example of a user privacy system 100 that is integrated into a vehicle 1102. For example, a vehicle implemented user privacy system 100 is similar to the other versions except that instead of a box or UPS 100 suitable for use on a table top or carried on the person, the UPS 100 integrated into a vehicle. For example, the UPS 100 can be installed in a vehicle's glovebox, dashboard, or center consul, and powered by the vehicle's electrical system. In some implementations, the USP 100 can be coupled to a vehicle display 1104 (e.g., a touchscreen) of the vehicle. The vehicle display can serve as the touchscreen display 122 of the UPS 100 described above. In some implementations, the UPS 100 can be also integrated with the vehicle's audio system. For example, the UPS 100 can be hardwired into the vehicle's audio system or coupled to the vehicle's audio system through wireless network to play audio from the mobile computing device 102 through the vehicle's audio system.

Various features described in reference to any one of the above implementations can be combined with any of the implementations described herein.

Implementations of the subject matter and the operations described in this specification can be realized in digital electronic circuitry, or in computer software, firmware, or hardware, including the structures disclosed in this specification and their structural equivalents, or in combinations of one or more of them. Implementations of the subject matter described in this specification can be realized using one or more computer programs, i.e., one or more modules of computer program instructions, encoded on computer storage medium for execution by, or to control the operation of, data processing apparatus. Alternatively or in addition, the program instructions can be encoded on an artificially generated propagated signal, for example, a machine-generated electrical, optical, or electromagnetic signal that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them. Moreover, while a computer, storage medium is not a propagated signal; a computer storage medium can be a source or destination of computer program instructions encoded in an artificially generated propagated signal. The computer storage medium can also be, or be included in, one or more separate physical components or media (e.g., multiple CDs, disks, or other storage devices).

The operations described in this specification can be implemented as operations performed by a data processing apparatus on data stored on one or more computer-readable storage devices or received from other sources.

The term "data processing apparatus" encompasses all kinds of apparatus, devices, and machines for processing data, including by way of example a programmable processor, a computer, a system on a chip, or multiple ones, or combinations, of the foregoing. The apparatus can include special purpose logic circuitry, for example, an FPGA (field programmable gate array) or an ASIC (application-specific integrated circuit). The apparatus can also include, in addition to hardware, code that creates an execution environment for the computer program in question, for example, code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform actions by operating on input data and generating output. The processes and logic flows can also be performed by, and apparatus can also be implemented as, special purpose logic circuitry, for example, an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. Elements of a computer can include a processor for performing actions in accordance with instructions and one or more memory devices for storing instructions and data. Generally, a computer will also include, or be operatively coupled to receive data from or transfer data to, or both, one or more mass storage devices for storing data, for example, magnetic, magneto-optical disks, or optical disks. However, a computer need not have such devices. Moreover, a computer can be embedded in another device, for example, a mobile telephone, a personal digital assistant (PDA), a mobile audio or video player, a game console, a Global Positioning System (GPS) receiver, or a portable storage device (e.g., a universal serial bus (USB) flash drive), to name just a few. Devices suitable for storing computer program instructions and data include all forms of non-volatile memory, media and memory devices, including by way of example semiconductor memory devices, for example, EPROM, EEPROM, and flash memory devices; magnetic disks, for example, internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented on a computer having a display device, for example, a CRT (cathode ray tube) or LCD (liquid crystal display) monitor, for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback, for example, visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Implementations of the subject matter described in this specification can be implemented in a computing system that includes a back-end component (e.g., such as a data server), or that includes a middleware component (e.g., an application server), or that includes a front-end component (e.g., a client computer having a graphical user interface or a Web browser through which a user can interact with an implementation of the subject matter described in this specification), or any combination of one or more such back-end, middleware, or front-end components. The components of the system can be interconnected by any form or medium of digital data communication (e.g., a communication network). Examples of communication networks include a local area network ("LAN") and a wide area network ("WAN"), an inter-network (e.g., the Internet), and peer-to-peer networks (e.g., ad hoc peer-to-peer networks).

The computing system can include clients and servers. A client and server are generally remote from each other and typically interact through a communication network. The relationship of client and server arises by virtue of computer programs running on the respective computers and having a client-server relationship to each other. In some implementations, a server transmits data (e.g., an HTML page) to a client device (e.g., for purposes of displaying data to and receiving user input from a user interacting with the client device). Data generated at the client device (e.g., a result of the user interaction) can be received from the client device at the server.

While this specification contains many specific implementation details, these should not be construed as limitations on the scope of any implementation of the present disclosure or of what may be claimed, but rather as descriptions of features specific to example implementations. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking and parallel processing may be advantageous.

What is claimed is:

1. A privacy system comprising:
   an acoustically insulated housing comprising an interior volume sized to contain a mobile computing device therein;
   an internal speaker system comprising at least one speaker arranged to direct sound into the interior volume;
   a communication interface; and
   a control system electrically coupled to the speaker system and the communication interface, wherein the control system is configured to perform operations comprising:
     causing the speaker system to emit voice obscuring noise into the interior volume of the housing;
     receiving, from the mobile computing device, data indicating content displayed on the mobile computing device;
     sending the data to a secondary device in communication with the communication interface;
     receiving, from the secondary device, input data indicating user inputs received from an input on the secondary device to remotely control functions of the mobile computing device; and
     providing the input data to the mobile computing device.

2. The system of claim 1, wherein the secondary device is one of a FOB, a wearable device, a remote tablet, or a wireless handset.

3. The system of claim 1, wherein the secondary device comprises:
   a microphone;
   a speaker; and
   a hardware on/off button configured to at least control active operation of the microphone.

4. The system of claim 1, wherein the control system comprises at least one processor electrically coupled to the speaker system and to the communication interface; and a data store electrically coupled to the at least one processor having instructions stored thereon which, when executed by the at least one processor, causes the at least one processor to perform the operations.

5. The system of claim 1, wherein the voice obscuring noise includes at least one of: white noise, pink noise, or human speech.

6. The system of claim 1, wherein the voice obscuring noise includes human speech comprising a voice of the user of the mobile computing device.

7. The system of claim 1, the operations further comprise:
   receiving an audio stream from the mobile computing device; and
   sending the audio stream to the secondary device to be played on the speaker of the secondary device.

8. The system of claim 1, wherein housing is installed in an upper surface of a table.

9. The system of claim 1, further comprising a projector, and wherein the operations further comprise causing the projector to present content received from the mobile computing device.

10. The system of claim 1, wherein the secondary device is integrated with or attached to the housing.

11. The system of claim 1, wherein the voice obscuring noise includes a plurality of human voices.

12. The system of claim 1, wherein secondary device is in wireless communication with the communication interface.

13. The system of claim 1, wherein the internal speaker system comprises a first speaker positioned to align with a first microphone of the mobile computing device when the mobile computing device is placed in the interior volume, and a second speaker positioned to align with a second microphone of the mobile computing device when the mobile computing device is placed in the interior volume.

14. The system of claim 13, wherein causing the speaker system to emit voice obscuring noise into the interior volume of the housing comprises causing the first speaker to emit a different voice obscuring noise than the second speaker.

15. The system of claim 1, further comprising a charging device configured to provide power to the mobile computing device.

16. A method executed by one or more processors of a privacy system, the method comprising:
   causing an interior speaker system to emit voice obscuring noise into an interior volume of a housing of the privacy system with a mobile computing device contained within the interior volume;
   receiving, from the mobile computing device, data indicating content displayed on a the mobile computing device;
   sending the data to a secondary device that is in wireless communication with the privacy system;
   receiving, from the secondary device, input data indicating user inputs received from an input on the secondary device to remotely control functions of the mobile computing device; and
   providing the input data to the mobile computing device.

17. The method of claim 16, wherein the voice obscuring noise includes at least one of: white noise, pink noise, or human speech.

18. The method of claim 16, further comprising:
   receiving an audio stream from the mobile computing device; and
   sending the audio stream to the secondary device to be played on the speaker of the secondary device.

19. The method of claim 16, wherein causing the interior speaker system to emit voice obscuring noise into the interior volume of the housing comprises causing a first speaker to emit a different voice obscuring noise than a second speaker.

20. A non-transitory computer readable storage medium storing instructions that, when executed by at least one processor, cause the at least one processor to perform operations comprising:
   causing an interior speaker system of a privacy system to emit voice obscuring noise into an interior volume of a housing of the privacy system with a mobile computing device contained within the interior volume;
   receiving, from the mobile computing device, data indicating content displayed on a the mobile computing device;
   sending the data to a secondary device that is in wireless communication with the privacy system;

receiving, from the secondary device, input data indicating user inputs received from an input on the secondary device to remotely control functions of the mobile computing device; and providing the input data to the mobile computing device.

* * * * *

UNITED STATES PATENT AND TRADEMARK OFFICE
CERTIFICATE OF CORRECTION

| | |
|---|---|
| PATENT NO. | : 11,243,568 B2 |
| APPLICATION NO. | : 17/034704 |
| DATED | : February 8, 2022 |
| INVENTOR(S) | : Tuttle |

It is certified that error appears in the above-identified patent and that said Letters Patent is hereby corrected as shown below:

In the Claims

Column 14, Line 33, Claim 16, delete "a the" and insert -- the --;

Column 14, Line 64, Claim 20, delete "a the" and insert -- the --.

Signed and Sealed this
Seventh Day of June, 2022

Katherine Kelly Vidal
*Director of the United States Patent and Trademark Office*